(12) United States Patent
Koizumi et al.

(10) Patent No.: US 8,080,923 B2
(45) Date of Patent: Dec. 20, 2011

(54) PIEZOELECTRIC/ELECTROSTRICTIVE MEMBRANE ELEMENT

(75) Inventors: Takaaki Koizumi, Tajimi (JP); Toshikatsu Kashiwaya, Inazawa (JP)

(73) Assignee: NGK Insulators, Ltd., Nagoya (JP)

( * ) Notice: Subject to any disclaimer, the term of this patent is extended or adjusted under 35 U.S.C. 154(b) by 221 days.

(21) Appl. No.: 12/316,079

(22) Filed: Dec. 9, 2008

(65) Prior Publication Data

US 2009/0152996 A1  Jun. 18, 2009

(30) Foreign Application Priority Data

Dec. 18, 2007 (JP) ................. 2007-325906

(51) Int. Cl.
  *H01L 41/187* (2006.01)
(52) U.S. Cl. ..................................... 310/358
(58) Field of Classification Search ................ 310/324, 310/358; 252/62.9 R, 62.9 PZ
  See application file for complete search history.

(56) References Cited

U.S. PATENT DOCUMENTS

| | | | |
|---|---|---|---|
| 5,688,731 A | 11/1997 | Chatterjee et al. | |
| 6,051,914 A * | 4/2000 | Nishiwaki | 310/358 |
| 2002/0056827 A1 | 5/2002 | Kashiwaya | |
| 2003/0067251 A1 | 4/2003 | Kashiwaya et al. | |
| 2003/0072972 A1 | 4/2003 | Kashiwaya et al. | |
| 2003/0170381 A1 | 9/2003 | Kashiwaya | |
| 2003/0198745 A1 | 10/2003 | Kashiwaya et al. | |
| 2004/0205948 A1 | 10/2004 | Kashiwaya et al. | |
| 2004/0207288 A1 * | 10/2004 | Funakubo et al. | 310/311 |
| 2006/0290240 A1 * | 12/2006 | Kitagawa et al. | 310/358 |
| 2007/0090728 A1 * | 4/2007 | Matsuda et al. | 310/358 |
| 2008/0266751 A1 | 10/2008 | Yamazuki et al. | |

FOREIGN PATENT DOCUMENTS

| | | |
|---|---|---|
| JP | 44-017103 B | 7/1969 |
| JP | 45-008145 B | 3/1970 |
| JP | 10458060 | 6/1998 |
| JP | 2002-217464 A1 | 8/2002 |
| JP | 2002-217465 A1 | 8/2002 |
| WO | 2007/074731 | 5/2007 |

\* cited by examiner

*Primary Examiner* — Derek Rosenau
(74) *Attorney, Agent, or Firm* — Burr & Brown (57) ABSTRACT

A piezoelectric/electrostrictive membrane element is provided, including a ceramic substrate, a membranous piezoelectric/electrostrictive portion including a piezoelectric/electrostrictive body made of a large number of crystal particles having a lead zirconate titanate based piezoelectric/electrostrictive ceramic composition, and membranous electrodes electrically connected to the piezoelectric/electrostrictive portion. The crystal particles include crystal main body portions, and surface layer portions arranged in at least a part of the outer periphery of crystal main body portions and having a crystal structure which is different from that of the crystal main body portions. The piezoelectric/electrostrictive portion is bonded in a solid state to the substrate directly or via electrodes.

7 Claims, 5 Drawing Sheets
(2 of 5 Drawing Sheet(s) Filed in Color)

PIEZOELECTRIC/ELECTROSTRICTIVE MEMBRANE ELEMENT

BACKGROUND OF THE INVENTION

1. Field of the Invention

The present invention relates to a piezoelectric/electrostrictive membrane element including a piezoelectric/electrostrictive portion having excellent piezoelectric/electrostrictive characteristics, and having a large flexural displacement.

2. Description of the Related Art

Heretofore, a piezoelectric/electrostrictive element has been known as an element capable of controlling micro displacement of the order of sub-microns. In particular, a piezoelectric/electrostrictive element is suitable for the control of the micro displacement. In the element, a piezoelectric/electrostrictive body (piezoelectric/electrostrictive portion) constituted of a piezoelectric/electrostrictive ceramic composition and an electrode portion to which a voltage is applied are laminated on a substrate constituted of a ceramic material. In addition, the element has excellent characteristics such as a high electromechanical conversion efficiency, a high-speed response, a high durability and a saved power consumption. The piezoelectric/electrostrictive element is used in various applications such as a piezoelectric pressure sensor, a probe moving mechanism of a scanning type tunnel microscope, a rectilinear guide mechanism in an ultra-precise working device, a servo valve for hydraulic control, a head of a VTR device, a pixel constituting a flat panel type image display device and a head of an ink jet printer.

Moreover, the piezoelectric/electrostrictive ceramic composition constituting the piezoelectric/electrostrictive body is also variously investigated. For example, there has been disclosed a $Pb(Mg_{1/3}Nb_{2/3})O_3$—$PbZrO_3$—$PbTiO_3$ three-component solid solution composition, or a piezoelectric/electrostrictive ceramic composition in which a part of Pb in the composition is replaced with Sr, La or the like (see, e.g., Patent Documents 1 and 2). As to the piezoelectric/electrostrictive body itself which is the most important portion for determining piezoelectric/electrostrictive characteristics of the piezoelectric/electrostrictive element, the piezoelectric/electrostrictive element is expected to be obtained which has excellent piezoelectric/electrostrictive characteristics (e.g., piezoelectric d constant).

On the other hand, it is disclosed that when the piezoelectric/electrostrictive body is formed using a piezoelectric/electrostrictive ceramic composition containing as a main component a predetermined PMN-PZ-PT three-component solid solution composition containing Ni or an oxide of Ni, it is possible to manufacture a piezoelectric/electrostrictive element which has excellent piezoelectric/electrostrictive characteristics and in which linearity of a flexural displacement with respect to an electric field is high up to a high electric field region (see, e.g., Patent Documents 3, 4).

However, in view of rapid technical progress in recent years, there is supposed a case where it cannot be said that the piezoelectric/electrostrictive body and the piezoelectric/electrostrictive element disclosed in Patent Documents 3, 4 sufficiently satisfy the piezoelectric/electrostrictive characteristics. Therefore, a demand for the development of the piezoelectric/electrostrictive body or the piezoelectric/electrostrictive element having further improved piezoelectric/electrostrictive characteristics has risen.

Figure 2:
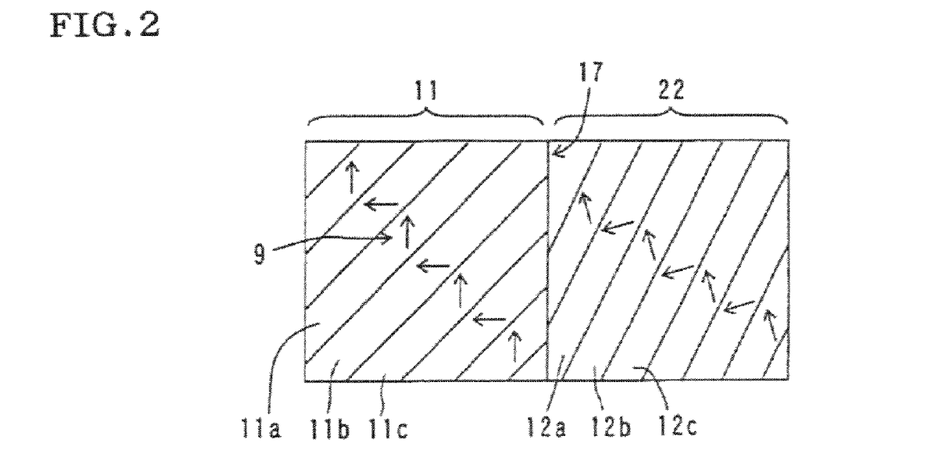
FIG. 2 is a sectional view schematically showing one example of the state of crystal particles of a piezoelectric/electrostrictive body constituting a piezoelectric/electrostrictive portion of a conventional piezoelectric/electrostrictive membrane element.

FIG. 2 is a sectional view schematically showing one example of a state of crystal particles of the piezoelectric/electrostrictive body constituting the piezoelectric/electrostrictive portion of the conventional piezoelectric/electrostrictive membrane element. As shown in FIG. 2, in the conventional piezoelectric/electrostrictive body, a large number of crystal particles 11, 22 are usually constituted of a plurality of domains 11a to 11c, 12a to 12c having inherent crystal directions 9. Moreover, the adjacent crystal particles 11, 22 are arranged so as to come in contact with each other, and a crystal grain boundary 17 is formed. When an electric field is applied to such a piezoelectric/electrostrictive body, an electrically induced strain is generated by the non-180° rotation of the domains 11a to 11c, 12a to 12c.

[Patent Document 1] JP-B-44-17103
[Patent Document 2] JP-B-45-8145
[Patent Document 3] JP-A-2002-217464
[Patent Document 4] JP-A-2002-217465

The piezoelectric/electrostrictive body is usually constituted by sintering a large number of crystal particles or the like. Therefore, as shown in FIG. 2, the domains 11a to 11c, 12a to 12c bind one another owing to a crystal direction difference between the adjacent crystal particles 11 and 22 based on a difference between the crystal directions 9 of the domains 11a to 11c, 12a to 12c, and hence it is supposed that the adjacent crystal particles 11, 12 mutually disturb deformation. In consequence, it is supposed that displacement which should originally occur if there were not any influence of the adjacent crystal particles is offset not a little.

SUMMARY OF THE INVENTION

The present invention has been developed in view of such a conventional technical problem, and an object thereof is to provide a piezoelectric/electrostrictive membrane element which has a large flexural displacement with quite little formation of a micro crack and/or a lattice defect due to a concentrated stress which is a disadvantage.

As a result of intensive investigation for achieving the above object, the present inventors have found that the above object can be achieved by forming a piezoelectric/electrostrictive body of crystal particles having a constitution in which a surface layer portion having a crystal structure different from that of a crystal main body portion is arranged in at least a part of the outer periphery of the crystal main body portion, and the present invention has been completed.

That is, according to the present invention, the following piezoelectric/electrostrictive membrane element is provided.

According to a first aspect of the present invention, a piezoelectric/electrostrictive membrane element is provided, comprising a substrate made of a ceramic material, a membranous piezoelectric/electrostrictive portion including a piezoelectric/electrostrictive body constituted of a large number of crystal particles of a lead zirconate titanate based piezoelectric/electrostrictive ceramic composition, and membranous electrodes electrically connected to the piezoelectric/electrostrictive portion, the crystal particles including a crystal main body portion having a predetermined crystal structure, and a surface layer portion arranged in at least a part of the outer periphery of the crystal main body portion and having a crystal structure which is different from that of the crystal main body portion, the piezoelectric/electrostrictive portion being bonded in a solid state to the substrate directly or via the electrodes.

According to a second aspect of the present invention, a piezoelectric/electrostrictive membrane element according to the first aspect is provided, wherein the average thickness of the surface layer portion is in a range of 1 to 15% of the average particle diameter of the crystal particles.

According to a third aspect of the present invention, a piezoelectric/electrostrictive membrane element according to the above first or second aspects is provided, wherein the crystal structure of the crystal main body portion includes at least a tetragonal system, and the crystal structure of the surface layer portion includes at least one selected from the group consisting of a rhombic system, a monoclinic system and a quasi-cubic system.

According to a fourth aspect of the present invention, a piezoelectric/electrostrictive membrane element according to any one of the above first to third aspects is provided, wherein the piezoelectric/electrostrictive ceramic composition contains a $PbMg_{1/3}Nb_{2/3}O_3$—$PbZrO_3$—$PbTiO_3$ three-component solid solution composition as a main composition, and further contains 0.5 to 10 mass % of NiO.

According to a fifth aspect of the present invention, a piezoelectric/electrostrictive membrane element according to the above fourth aspect is provided, wherein the $PbMg_{1/3}Nb_{2/3}O_3$—$PbZrO_3$—$PbTiO_3$ three-component solid solution composition is represented by the following general formula (1):

$$Pb_x(Mg_{y/3}Nb_{2/3})_aTi_bZr_cO_3 \qquad (1)$$

wherein $0.95 \leq x \leq 1.05$, $0.8 \leq y \leq 1.0$, and a, b, and c are decimals in a range surrounded by (a, b, c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in a coordinate whose coordinate axes are a, b, and c, wherein a+b+c=1.000.

According to a sixth aspect of the present invention, a piezoelectric/electrostrictive membrane element according to any one of the above first to third aspects is provided, wherein the piezoelectric/electrostrictive ceramic composition contains a $Pb(Mg, Ni)_{1/3}Nb_{2/3}O_3$—$PbZrO_3$—$PbTiO_3$ three-component solid solution composition.

According to a seventh aspect of the present invention, a piezoelectric/electrostrictive membrane element according to the above sixth aspect is provided, wherein the $Pb(Mg, Ni)_{1/3}Nb_{2/3}O_3$—$PbZrO_3$—$PbTiO_3$ three-component solid solution composition is represented by the following general formula (2):

$$Pb_x\{(Mg_{1-y}Ni_y)_{(1/3)xa}Nb_{2/3}\}_bTi_cZr_dO_3 \qquad (2),$$

wherein $0.95 \leq x \leq 1.05$, $0 \leq y \leq 1.00$, $0.90 \leq a \leq 1.10$, and b, c, and d are decimals in a range surrounded by (b, c, d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in a coordinate whose coordinate axes are b, c, and d, wherein b+c+d=1.000.

The piezoelectric/electrostrictive membrane element of the present invention has a meritorious advantage that the element has a large flexural displacement with quite little formation of a micro crack and/or a lattice defect due to a concentrated stress which is a disadvantage.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

EXPLANATION OF REFERENCE NUMERALS USED IN DRAWINGS 10, 20, 11, 22: crystal particles; 1a, 1b, 1c, 2a, 2b, 2c, 11a, 11b, 11c, 12a, 12b, 12c: domain; 13, 13b, 23, 23b: crystal main body portion; 7, 17: crystal grain boundary; 9: crystal direction; 15, 15b, 25, 25b: surface layer portion; 30, 31, 32: electrode; 35: piezoelectric/electrostrictive element unit; 10, 42: piezoelectric/electrostrictive portion; 45: second piezoelectric/electrostrictive portion; 47: first piezoelectric/electrostrictive portion; 50: substrate; 50a: bonded surface in solid state; 50b: thick portion; 50c: thin diaphragm portion; 51: piezoelectric/electrostrictive membrane element; 55: common substrate; 60: cavity portion

DETAILED DESCRIPTION OF THE INVENTION

A best mode for carrying out the present invention will be described hereinafter, but it should be understood that the present invention is not limited to the following embodiments, and the present invention includes appropriate alterations, modifications and the like added to the following embodiments based on the ordinary knowledge of any person skilled in the art without departing from the scope of the present invention.

Figure 1:
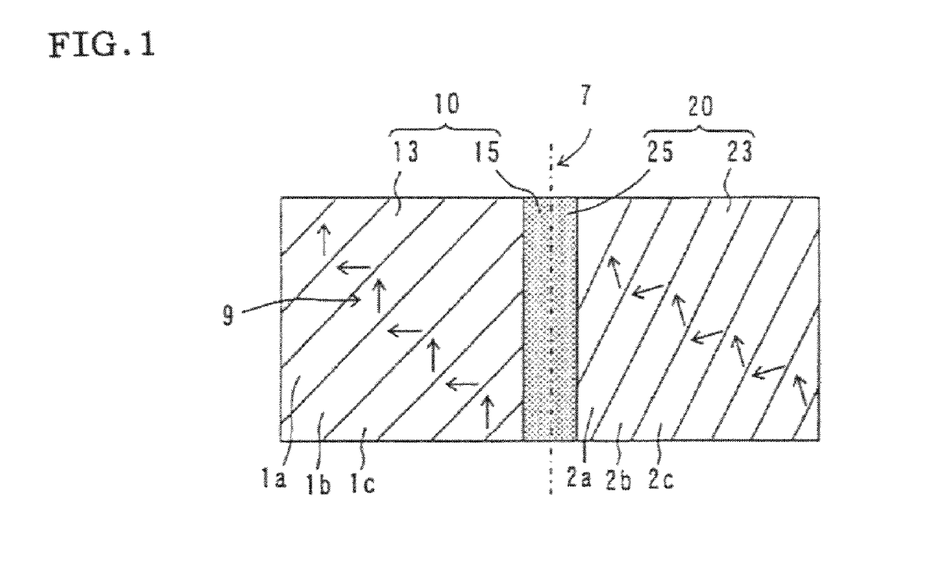
FIG. 1 is a sectional view schematically showing one example of the state of crystal particles of a piezoelectric/electrostrictive body constituting a piezoelectric/electrostrictive portion of a piezoelectric/electrostrictive membrane element of the present invention.

FIG. 1 is a sectional view schematically showing one example of the state of crystal particles of a piezoelectric/electrostrictive body constituting a piezoelectric/electrostrictive portion of a piezoelectric/electrostrictive membrane element of the present invention. As shown in FIG. 1, the piezoelectric/electrostrictive body constituting the piezoelectric/electrostrictive portion of the piezoelectric/electrostrictive membrane element according to the present invention is constituted by, for example, sintering a large number of crystal particles 10, 20. These crystal particles 10, 20 are particles constituted of a lead zirconate titanate (PZT) based piezoelectric/electrostrictive ceramic composition.

There is not any special restriction on the type of the piezoelectric/electrostrictive ceramic composition constituting the crystal particles 10, 20, as long as the type is a PZT-based piezoelectric/electrostrictive material. However, from a viewpoint that the piezoelectric/electrostrictive body having more excellent piezoelectric/electrostrictive characteristics be provided, preferable examples of the composition include (1) a composition containing a $PbMg_{1/3}Nb_{2/3}O_3$—$PbZrO_3$—$PbTiO_3$ three-component solid solution composition as a main component, and further containing 0.5 to 10 mass % of NiO and (2) a composition containing a $Pb(Mg, Ni)_{1/3}Nb_{2/3}O_3$—$PbZrO_3$—$PbTiO_3$ three-component solid solution composition.

It is preferable that, as a composition containing the $PbMg_{1/3}Nb_{2/3}O_3$—$PbZrO_3$—$PbTiO_3$ three-component solid solution composition as the main component and further containing 0.5 to 10 mass % of NiO, the composition is represented by the following general formula (1):

$$Pb_x(Mg_{y/3}Nb_{2/3})_aTi_bZr_cO_3 \quad (1)$$

in which $0.95 \leq x \leq 1.05$, $0.8 \leq y \leq 1.0$, and a, b, and c are decimals (with the proviso that $a+b+c=1.000$) in a range surrounded by (a, b, c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in a coordinate whose coordinate axes are a, b, and c. This is because the piezoelectric/electrostrictive body or the piezoelectric/electrostrictive portion having higher piezoelectric/electrostrictive characteristics can be formed.

Here, the "main component" in the "the $PbMg_{1/3}Nb_{2/3}O_3$—$PbZrO_3$—$PbTiO_3$ three-component solid solution composition as the main component" indicates that a content ratio of the $PbMg_{1/3}Nb_{2/3}O_3$—$PbZrO_3$—$PbTiO_3$ three-component solid solution composition is 99.5 mass % or more, preferably 99.8 mass % or more with respect to the whole piezoelectric/electrostrictive ceramic composition excluding NiO.

It is to be noted that the content ratio of NiO is preferably 0.5 to 10 mass %, further preferably 0.5 to 8 mass %, especially preferably 1 to 6 mass %. When the content ratio of NiO is defined in the above-described numeric value range, it is possible to suppress the formation of a hetero-phase in the resultant piezoelectric/electrostrictive body and portion. It is possible to form the piezoelectric/electrostrictive body or portion having a large occupying ratio of a perovskite phase contributing to an electrically induced strain, a high density and remarkably high piezoelectric/electrostrictive characteristics.

On the other hand, the composition (2) containing the $Pb(Mg, Ni)_{1/3}Nb_{2/3}O_3$—$PbZrO_3$—$PbTiO_3$ three-component solid solution composition is preferably represented by the following general formula (2) in that the piezoelectric/electrostrictive body or portion having higher piezoelectric/electrostrictive characteristics can be formed. It is to be noted that this piezoelectric/electrostrictive ceramic composition is preferably substantially constituted of the $Pb(Mg, Ni)_{1/3}Nb_{2/3}O_3$—$PbZrO_3$—$PbTiO_3$ three-component solid solution composition.

$$Pb_x\{(Mg_{1-y}Ni_y)_{(1/3)xa}Nb_{2/3}\}_bTi_cZr_dO_3 \quad (2),$$

in which $0.95 \leq x \leq 1.05$, $0 \leq y \leq 1.00$, $0.90 \leq a \leq 1.10$, and b, c, and d are decimals (with the proviso that $(b+c+d)=1.000$) in a range surrounded by (b, c, d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in a coordinate whose coordinate axes are b, c, and d.

As shown in FIG. 1, the crystal particles 10, 20 are constituted of crystal main body portions 13, 23 having a predetermined crystal structure, and surface layer portions 15, 25 having a crystal structure different from that of the crystal main body portions 13, 23, respectively. The crystal main body portions 13, 23 are constituted of a plurality of domains 1a to 1c, 2a to 2c having an inherent crystal direction 9. Moreover, the surface layer portion 15 or 25 is arranged in at least a part of the outer periphery of the crystal main body portion 13 or 23. That is, the surface layer portions 15, 25 are arranged in a position where the adjacent crystal particles 10, 20 come in contact with each other. It is to be noted that in FIG. 1, reference numeral 7 is a crystal grain boundary.

Moreover, the crystal main body portions 13, 23 and the surface layer portions 15, 25 integrally constitute the crystal particles 10, 20, respectively. The composition of the surface layer portions 15, 25 is usually the same as that of the crystal main body portions 13, 23. In consequence, when an electric field is applied, the crystal phase of the surface layer portions 15, 25 is the same as that of the crystal main body portions 13, 23, and deformation can continuously be propagated to the adjacent domains 1a to 1c, 2a to 2c. It is to be noted that the crystal structure of the crystal main body portions 13, 23 specifically includes at least a tetragonal system. Moreover, the crystal structure of the surface layer portions 15, 25 specifically includes at least one selected from the group consisting of a rhombic system, a monoclinic system and a quasi-cubic system.

As shown in FIG. 1, the crystal particles 10, 20 of the piezoelectric/electrostrictive body constituting the piezoelectric/electrostrictive portion of the piezoelectric/electrostrictive membrane element according to the present invention are formed so that the surface layer portions 15, 25 having a crystal structure different from that of the crystal main body portions 13, 23 are arranged in at least a part of the outer periphery of the crystal main body portions 13, 23. It is supposed that when the crystal particles 10, 20 have such a structure (a so-called "core-shell structure" in which the crystal main body portion is a "core" and the surface layer portion is a "shell"), the binding of the domains 1a to 1c, 2a to 2c having a large crystal direction difference to one another can be decreased. Consequently, it is supposed that the characteristics (the piezoelectric/electrostrictive characteristics, a displacement amount, etc.) of the piezoelectric/electrostrictive body are improved as compared with the piezoelectric/electrostrictive body constituting the piezoelectric/electrostrictive portion of a conventional element shown in, for example, FIG. 2.

In addition, in JP-A-2007-204336, a lead-free piezoelectric ceramic material constituted of a poly-crystal material forming composite particles of a quasi-core-shell structure including core particles and shell particles having different compositions is disclosed as a material having excellent denseness and hardly causing dielectric breakdown. However, the core particles and the shell particles constituting this lead-free piezoelectric ceramic material constitute independent particles, respectively, and the shell particles are arranged so as to surround the core particles. That is, the lead-free piezoelectric ceramic material disclosed in JP-A-2007-204336 has a constitution definitely different from that of the piezoelectric/electrostrictive body (see FIG. 1) including the crystal particles 10, 20 integrally formed of the crystal main body portions 13, 23 and the surface layer portions 15, 25.

Figure 10:
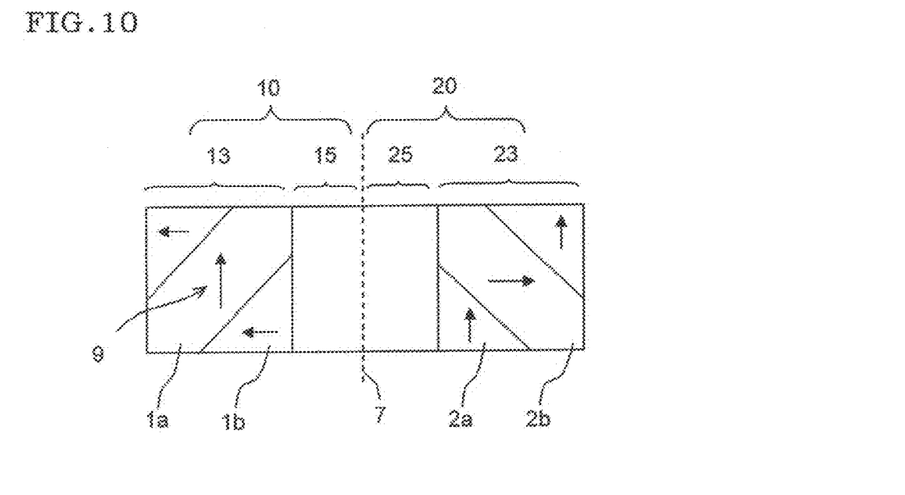
FIG. 10 is a schematic diagram showing the state of the piezoelectric/electrostrictive body of FIG. 1 before applying an electric field.
Figure 12:
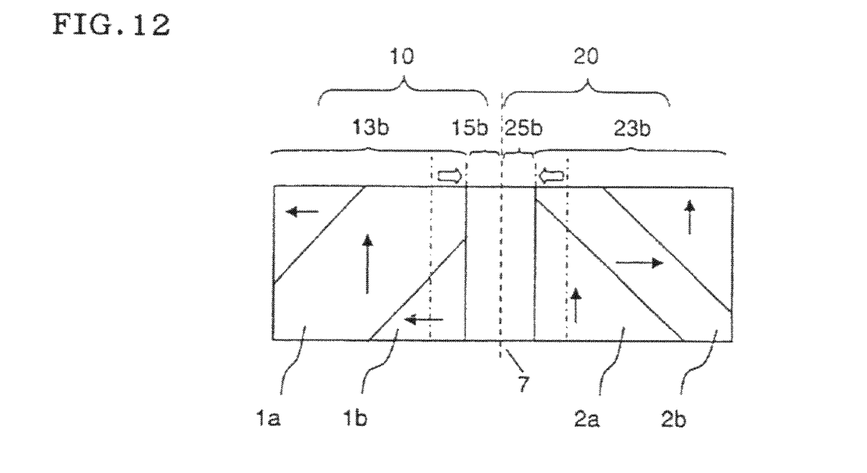
FIG. 12 is a schematic diagram showing the state of the piezoelectric/electrostrictive body of FIG. 1 after applying the electric field.

FIG. 10 is a schematic diagram showing the state of the piezoelectric/electrostrictive body of FIG. 1 before applying an electric field, and FIG. 12 is a schematic diagram showing the state of the piezoelectric/electrostrictive body of FIG. 1 after applying the electric field. When the electric field is applied to the piezoelectric/electrostrictive body shown in FIGS. 1 and 10, as shown in FIG. 12, with the piezoelectric/electrostrictive deformation of crystal main body portions 13b, 23b, surface layer portions 15b, 25b cause electrically induced phase transition. The electrically induced phase transition of the surface layer portions 15b, 25b can be confirmed in accordance with the change of an X-ray diffraction measurement profile. That is, the surface layer portions 15b, 25b cause the phase transition so as to follow the deformation of domains 1a to 1c, 2a to 2c (see FIGS. 10 and 12). Consequently, in addition to the deformation of the domains 1a, 1b, 2a and 2b constituting the crystal main body portions 13b, 23b, the deformation of the surface layer portions 15b, 25b is superimposed. Therefore, it is supposed that as compared with the conventional piezoelectric/electrostrictive body shown in, for example, FIG. 2, the characteristics (the piezoelectric/electrostrictive characteristics, a displacement amount, etc.) of the piezoelectric/electrostrictive body are improved. It is to be noted that in FIG. 12, white arrows indicate that boundaries between the surface layer portions 15b, 25b and the crystal main body portions 13b, 23b have moved owing to the application of the electric field.

Figure 11:
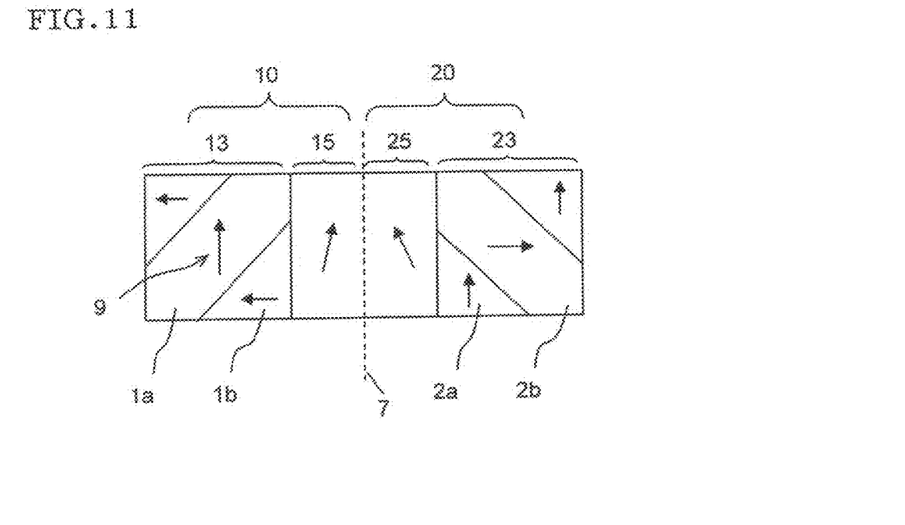
FIG. 11 is a sectional view schematically showing another example of the state of the crystal particles of the piezoelectric/electrostrictive body constituting the piezoelectric/electrostrictive portion of the piezoelectric/electrostrictive membrane element of the present invention.
Figure 13:
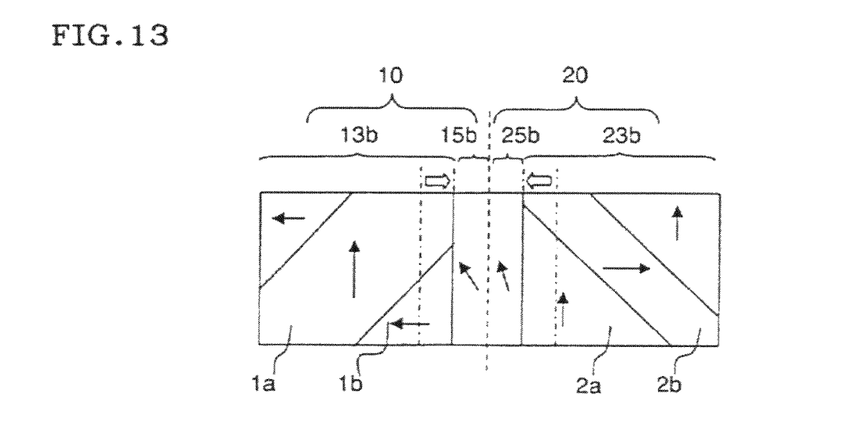
FIG. 13 is a schematic diagram showing the state of the piezoelectric/electrostrictive body of FIG. 11 after applying the electric field.

FIG. 11 is a sectional view schematically showing another example of the state of the crystal particles of the piezoelectric/electrostrictive body constituting the piezoelectric/electrostrictive portion of the piezoelectric/electrostrictive membrane element of the present invention. It is to be noted that FIG. 11 shows a state before an electric field is applied to the piezoelectric/electrostrictive body. As shown in FIG. 11, a domain having spontaneous polarization (e.g., a rhombic system, a monoclinic system, a quasi-cubic system or the like) is sometimes present in the surface layer portions 15, 25. Moreover, FIG. 13 is a schematic diagram showing the state of the piezoelectric/electrostrictive body of FIG. 11 after applying the electric field. When the electric field is applied to the piezoelectric/electrostrictive body shown in FIG. 11, as shown in FIG. 13, with the piezoelectric/electrostrictive deformation of the crystal main body portions 13b, 23b, the surface layer portions 15b, 25b cause electrically induced phase transition. That is, the surface layer portions 15b, 25b cause the phase transition so as to follow the deformation of the domains 1a, 1b, 2a and 2b (see FIGS. 11 and 13). Consequently, in addition to the deformation of the domains 1a, 1b, 2a and 2b constituting the crystal main body portions 13b, 23b, the deformation of the surface layer portions 15b, 25b is superimposed, and large displacement is therefore generated.

Figure 14:
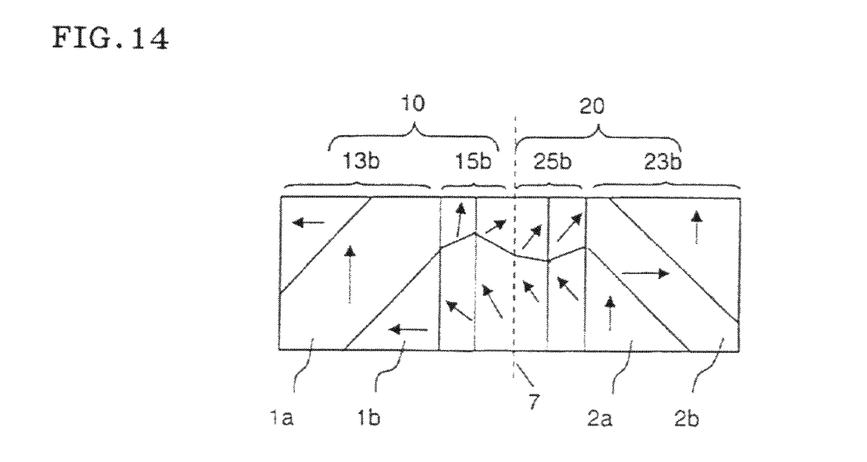
FIG. 14 is a sectional view schematically showing still another example of the state of the crystal particles of the piezoelectric/electrostrictive body constituting the piezoelectric/electrostrictive portion of the piezoelectric/electrostrictive membrane element of the present invention.

FIG. 14 is a sectional view schematically showing still another example of the state of the crystal particles of the piezoelectric/electrostrictive body constituting the piezoelectric/electrostrictive portion of the piezoelectric/electrostrictive membrane element of the present invention. It is to be noted that FIG. 14 shows a state after the electric field is applied to the piezoelectric/electrostrictive body. As shown in FIG. 14, the structure of the surface layer portions 15, 25 is sometimes a multilayer structure in which a plurality of domains are obliquely connected.

The crystal particles 10, 20 have an average particle diameter of usually 0.1 to 10 μm, preferably 0.2 to 8.5 μm, further preferably 0.3 to 7 μm. Since the domains sometimes do not sufficiently develop in the piezoelectric/electrostrictive body if When the average particle diameter of the crystal particles 10, 20 is less than 0.1 μm, the piezoelectric/electrostrictive characteristics are sometimes lowered. On the other hand, since the domains in the piezoelectric/electrostrictive body sufficiently develop, while the domains do not easily move if the average particle diameter exceeds 10 μm, the piezoelectric/electrostrictive characteristics are sometimes lowered. It is to be noted that the surface layer portions 15, 25 have an average thickness of usually 1 nm to 1.5 μm, preferably 2 nm to 1.3 μm, further preferably 3 nm to 1.0 μm.

The surface layer portions 15, 25 have an average thickness in a range of preferably 1 to 15% of the average particle diameter of the crystal particles 10, 20, further preferably 2 to 7%, especially preferably 2 to 4%. Moreover, since the surface layer portions 15, 25 becomes too thin if the average thickness of the surface layer portions 15, 25 is less than 1% of the average particle diameter of the crystal particles 10, 20, the deformed domains 1a to 1c, 2a to 2c generated by the electrically induced phase transition easily bond one another, and the effect of the improvement of the piezoelectric/electrostrictive characteristics sometimes becomes insufficient. On the other hand, since the deformation effect is decreased if the average thickness exceeds 15%, the crystal main body portion in the crystal particles becomes less than 70% in terms of volume ratio, a stress caused by the deformation of the domains 1a to 1c, 2a to 2c generated in the crystal main body portions 13, 23 is excessively relaxed in the surface layer portions 15, 25, and the deformation is not easily continuously transmitted to the adjacent crystal particles 10, 20.

It is known that the thermal expansion coefficient of a lead (Pd) based piezoelectric/electrostrictive ceramic composition changes at Curie point as a phase transformation point. As to the piezoelectric/electrostrictive membrane element, a thermal expansion difference is present between a substrate and the piezoelectric/electrostrictive body (the piezoelectric/electrostrictive portion) constituted of the piezoelectric/electrostrictive ceramic composition, and the thermal expansion difference at a temperature of Curie point or less is larger than that at a temperature in excess of Curie point. Therefore, at the temperature of Curie point or less, the stress generated in the substrate or the piezoelectric/electrostrictive portion also comparatively enlarges. However, to relax the generated stress, the piezoelectric/electrostrictive ceramic composition constituting the piezoelectric/electrostrictive portion deforms the shell portions of the crystal particles to which the stress is most easily applied (the phase transformation), and comes in a quasi-stable state. Here, when the electric field is applied to the piezoelectric/electrostrictive portion, the crystal particles constituting the piezoelectric/electrostrictive portion are deformed by the effect of an electrically induced strain. However, it is supposed that the shell portion of the crystal particle which comes in contact with the adjacent crystal particle works so as to release an internal stress generated by the deformation due to the electrically induced strain effect and a thermal stress due to the deformation of the electrically induced strain effect of the shell portion itself, thereby resulting in the phase transformation from the quasi-stable state (other than a tetragonal system) to a stable state (the tetragonal system). However, it is supposed that when a substrate having a thermal expansion coefficient different from that of the piezoelectric/electrostrictive ceramic composition is not disposed and the whole constitution has an equal thermal expansion coefficient as in a laminated capacitor, any stress due to the thermal expansion difference based on the difference of the material is not generated, and hence the electrically induced phase transition strain effect due to the stress release cannot be obtained.

Figure 3:
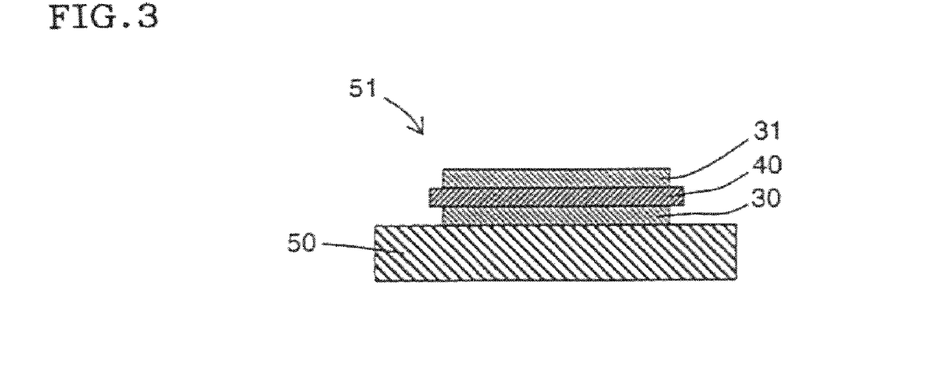
FIG. 3 is a sectional view schematically showing one embodiment of a piezoelectric/electrostrictive membrane element of the present invention.

FIG. 3 is a sectional view schematically showing one embodiment of the piezoelectric/electrostrictive membrane element of the present invention. As shown in FIG. 3, a piezoelectric/electrostrictive membrane element 51 of the present embodiment includes a substrate 50 made of a ceramic material, a membranous piezoelectric/electrostrictive portion 40, and membranous electrodes 30, 31 electrically connected to the piezoelectric/electrostrictive portion 40, and the piezoelectric/electrostrictive portion 40 is bonded in a solid state to the substrate 50 in a state in which the electrode 30 is interposed. It is to be noted that the piezoelectric/electrostrictive portion may directly be bonded in a solid state to the substrate without interposing any electrode. Here, the term "bonded in a solid state" used in the present specification indicates that the piezoelectric/electrostrictive portion 40 is formed closely integrally with the substrate 50 or the electrode 30 by a solid-phase reaction therebetween without using any organic or inorganic adhesive (i.e., the bonding between the piezoelectric/electrostrictive portion and the substrate is achieved by solidifying the molten portion(s) between the piezoelectric/electrostrictive portion and the substrate after firing).

The piezoelectric/electrostrictive portion 40 of the piezoelectric/electrostrictive membrane element 51 of the present embodiment is constituted of the above-mentioned piezoelectric/electrostrictive body. That is, as shown in FIG. 1, the piezoelectric/electrostrictive portion 40 of the piezoelectric/electrostrictive membrane element 51 of the present embodiment is constituted of a large number of crystal particles 10, 20 of a lead zirconate titanate based piezoelectric/electrostrictive ceramic composition, and the crystal particles 10, 20 is constituted of a piezoelectric/electrostrictive body including the crystal main body portions 13, 23, and the surface layer portions 15, 25 arranged in at least a part of the outer periphery of the crystal main body portions 13, 23 and having a crystal structure different from that of the crystal main body portions 13, 23. Therefore, the piezoelectric/electrostrictive membrane element 51 of the present embodiment includes the piezoelectric/electrostrictive portion 40 having excellent piezoelectric/electrostrictive characteristics and a large flexural displacement.

Figure 5:
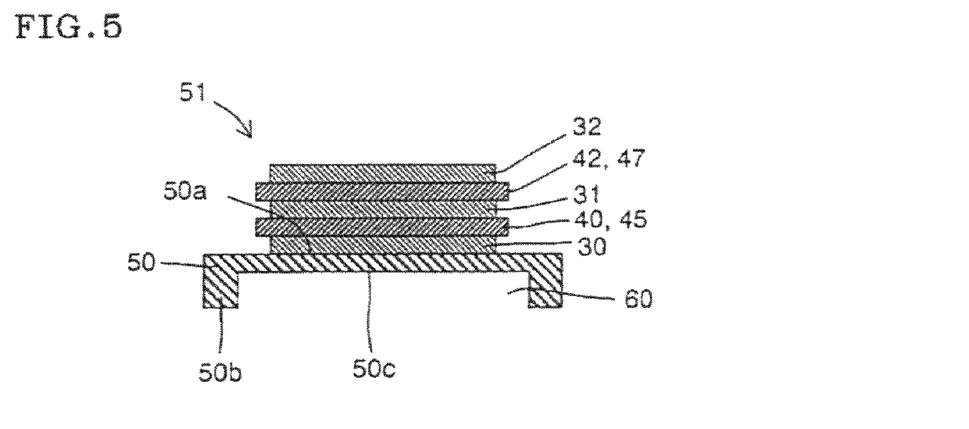
FIG. 5 is a sectional view showing still another embodiment of the piezoelectric/electrostrictive membrane element of the present invention.

As shown in FIG. 5, the piezoelectric/electrostrictive membrane element preferably has a constitution including a plurality of piezoelectric/electrostrictive portions 40, 42 and a plurality of electrodes 30, 31 and 32, the plurality of piezoelectric/electrostrictive portions 40, 42 and the plurality of electrodes 30, 31 and 32 being alternately sandwiched and laminated. The constitution of the piezoelectric/electrostrictive membrane element 51 shown in FIG. 5 is a so-called multilayered constitution, which is preferable in that a large flexural displacement can be obtained with a low voltage.

In the piezoelectric/electrostrictive membrane element 51 of the present embodiment (see FIG. 1), the piezoelectric/electrostrictive portion 40 has a thickness of preferably 0.5 to 50 µm, further preferably 1 to 20 µm, especially preferably 1 to 10 µm. If the thickness of the piezoelectric/electrostrictive portion 40 is less than 0.5 µm, sometimes the large flexural displacement can not be obtained. On the other hand, since the contraction stress of the piezoelectric/electrostrictive ceramic composition during firing becomes large if the thickness of the piezoelectric/electrostrictive portion 40 exceeds 50 µm, the substrate 50 needs to be thickened so as to prevent the substrate 50 from being collapsed, and it is sometimes difficult to cope with the miniaturization of the element. It is to be noted that the thickness of the piezoelectric/electrostrictive portions 40, 42 in a case where the piezoelectric/electrostrictive membrane element 51 is of a so-called multilayered type is the thickness of each of the piezoelectric/electrostrictive portions 40, 42.

The substrate 50 is constituted of a ceramic material, and there is not any special restriction on the type of this ceramic material. This ceramic material preferably contains at least one kind selected from the group consisting of stabilized zirconium oxide (zirconia), aluminum oxide, magnesium oxide, mullite, aluminum nitride, silicon nitride and glass from the viewpoints of heat resistance, chemical stability and insulating property. Above all, stabilized zirconium oxide (zirconia) is more preferable because the material has a large mechanical strength and excellent tenacity. It is to be noted that "stabilized zirconium oxide" mentioned in the present specification is zirconium oxide in which the phase transition of crystals is suppressed by the addition of a stabilizer, and partially stabilized zirconium oxide is included in addition to stabilized zirconium oxide.

Examples of stabilized zirconium oxide include zirconium oxide containing as the stabilizer 1 to 30 mol % of calcium oxide, magnesium oxide, yttrium oxide, scandium oxide, ytterbium oxide, cerium oxide or an oxide of a rare earth metal. Above all, zirconium oxide preferably contains yttrium oxide as the stabilizer, because a vibrating portion obtains an especially high mechanical strength. In this case, zirconium oxide contains preferably 1.5 to 6 mol %, more preferably 2 to 4 mol % of yttrium oxide. Zirconium oxide more preferably contains 0.1 to 5 mol % of aluminum oxide. The crystal phase of stabilized zirconium oxide may be a mixed phase of a cubic system+a monoclinic system, a mixed phase of a tetragonal system+the monoclinic system, a mixed phase of the cubic system+the tetragonal system+the monoclinic system or the like. However, a main crystal phase is preferably the tetragonal system, or the mixed phase of the tetragonal system+the cubic system, from the viewpoints of strength, tenacity and durability.

The substrate has a thickness in a range of preferably 1 µm to 1 mm, more preferably 1 to 10 µm, especially preferably 1 to 6 µm. Since the mechanical strength of the piezoelectric/electrostrictive membrane element is sometimes lowered if the thickness of the substrate is less than 1 µm. On the other hand, the rigidity of the substrate increases with respect to the generated contraction stress, and the flexural displacement of the piezoelectric/electrostrictive portion is sometimes decreased if the voltage is applied to the piezoelectric/electrostrictive portion, in a case where the thickness exceeds 1 mm.

Figure 4:
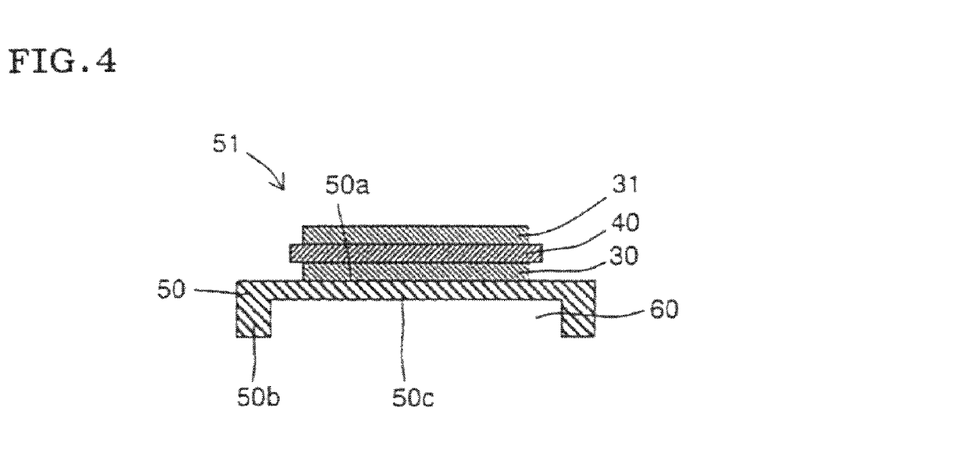
FIG. 4 is a sectional view showing another embodiment of the piezoelectric/electrostrictive membrane element of the present invention.
Figure 6:
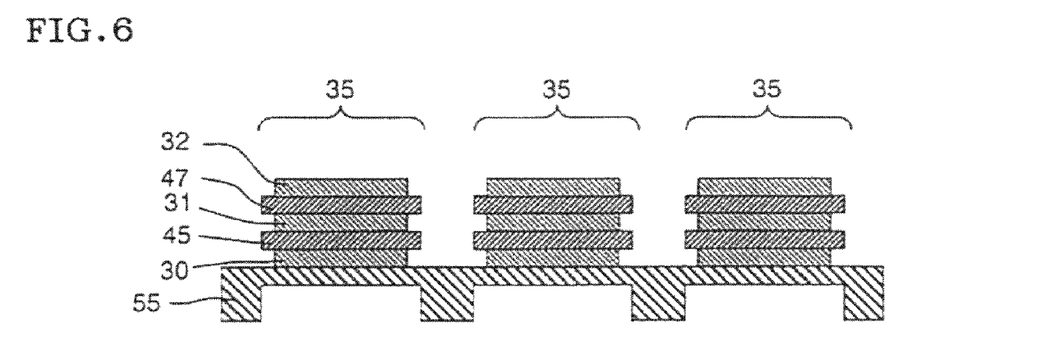
FIG. 6 is a sectional view showing a further embodiment of the piezoelectric/electrostrictive membrane element of the present invention.

However, as shown in FIG. 4, the substrate 50 may be formed into a shape provided with: a thin diaphragm portion 50c having one surface provided with a bonded surface in solid state 50a and having the above-described thickness; a thick portion 50b arranged in a portion other than a portion corresponding to this bonded surface in solid state 50a and having a thickness larger than that of the diaphragm portion 50c; and a cavity portion 60 formed by the diaphragm portion 50c and the thick portion 50b so as to communicate with the outside. It is to be noted that the electrode 30 (or the piezoelectric/electrostrictive portion) is arranged in a region substantially corresponding to the bonded surface in solid state 50a. That is, the piezoelectric/electrostrictive portion 40 is arranged on the outer surface (the bonded surface in solid state 50a) of the diaphragm portion 50c facing the cavity portion 60. When the substrate 50 is formed into such a shape, an element having a sufficiently large flexural displacement and a large mechanical strength can be constituted. Moreover, a common substrate 55 may be used in which the shape of the substrate 50 shown in FIG. 4 is continuously formed as shown in FIG. 6. On this common substrate 55, there may be arranged a plurality of piezoelectric/electrostrictive element units 35 each including a first piezoelectric/electrostrictive portion 47, a second piezoelectric/electrostrictive portion 45 and electrodes 30, 31 and 32.

There is not any special restriction on the surface shape of the substrate (the shape of the surface to which the electrode 30 is bonded in a solid state in FIG. 3). Examples of the surface shape include a rectangular shape, a square shape, a triangular shape, an elliptic shape, a perfectly circular shape, a curved square shape, a curved rectangular shape and a composite shape of a combination of these shapes. There is not any special restriction on the whole shape of the substrate, and the substrate may have a capsule shape having an appropriate internal space.

The electrode is electrically connected to the piezoelectric/electrostrictive portion, and is preferably arranged between the piezoelectric/electrostrictive portions. Moreover, the electrode is preferably arranged in a state in which a region substantially contributing to the flexural displacement or the like of the piezoelectric/electrostrictive portion is included. As shown in, for example, FIG. 5, the electrodes 30, 31, 32 are preferably arranged in a region of 80 area % or more of a face forming the first piezoelectric/electrostrictive portion 47 and the second piezoelectric/electrostrictive portion 45 including the vicinity of the center of the surface.

Examples of the material of the electrodes include at least one kind of metal selected from the group consisting of Pt, Pd, Rh, Au, Ag and an alloy of them. Above all, platinum or an alloy containing platinum as a main component is preferable because it has a high heat resistance in firing the piezoelectric/electrostrictive portion.

The electrode has a thickness of preferably 15 µm or less, further preferably 5 µm or less. When the thickness exceeds 15 µm, the electrode functions as a relaxing layer, and the flexural displacement is sometimes decreased. It is to be noted that from a viewpoint that the function of the electrode be substantially exerted, the electrode may have a thickness of 0.05 µm or more.

Next, one example of a method for manufacturing the piezoelectric/electrostrictive membrane element of the present invention will be described. First, one example of a method for manufacturing the piezoelectric/electrostrictive ceramic composition constituting the piezoelectric/electrostrictive body of the piezoelectric/electrostrictive membrane element will be described. To manufacture the piezoelectric/electrostrictive ceramic composition, first, each element constituting the piezoelectric/electrostrictive material, an oxide or a carbonate of the element, a compound containing a plurality of elements and the like are mixed at a predetermined ratio. As a mixing method, a usual method may be used, and examples of the method include ball milling. Specifically, a predetermined amount of each raw material, a ball and water are put into a ball mill device, and the device is rotated only for a predetermined time to prepare a mixed slurry. Afterward, a water content included in the resultant mixed slurry can be evaporated, dried or removed by performing an operation such as filtering to obtain a mixed raw material.

When the resultant mixed raw material is calcined, the piezoelectric/electrostrictive ceramic composition can be obtained. The calcining may be performed in the outside air or an oxygen atmosphere. As to the resultant piezoelectric/electrostrictive ceramic composition, in a diffraction strength by an X-ray diffraction device, a ratio between the strength of the strongest diffraction line of a phase other than a perovskite and the strength of the strongest diffraction line of the perovskite phase is preferably 5% or less, more preferably 2% or less.

The resultant piezoelectric/electrostrictive ceramic composition is crushed using a usual rotary crushing device such as a ball mill, an attritor or a bead mill. When the peripheral speed of the rotary crushing device is set to 7 to 20 m/sec during crushing, a particle-like (or powder-like) piezoelectric/electrostrictive ceramic composition can be obtained. The surface of the particle-like piezoelectric/electrostrictive ceramic composition obtained by the crushing, for example, in a state in which the peripheral speed of the rotary crushing device is set to a predetermined speed in this manner is constituted of an amorphous phase and a crystal phase including a lattice strain. When the particle-like piezoelectric/electrostrictive ceramic composition having the surface constituted of such a crystal phase is used, as shown in FIG. 1, the piezoelectric/electrostrictive body having a so-called core-shell structure can be manufactured. When the peripheral speed is less than 7 m/sec, owing to a weak crushing force, it is sometimes difficult to obtain the desired surface state of the particle-like piezoelectric/electrostrictive ceramic composition. On the other hand, when the peripheral speed is 20 m/sec or more, a sharp particle size distribution cannot sometimes be obtained. Moreover, this particle-like piezoelectric/electrostrictive ceramic composition has an average particle diameter of preferably 0.02 to 1.0 µm, further preferably 0.05 to 0.7 µm. It is to be noted that the particle diameters may be adjusted by thermally treating the particle-like piezoelectric/electrostrictive ceramic composition at a predetermined temperature. In this case, finer particles are integrated with the other particles to constitute powder having a uniform particle diameter, and it is preferably possible to form the piezoelectric/electrostrictive body or portion having the uniform particle diameter. Moreover, the piezoelectric/electrostrictive ceramic composition may be prepared by, for example, an alkoxide process, a coprecipitation process or the like.

To manufacture the piezoelectric/electrostrictive membrane element of the present invention, a layer constituted of the piezoelectric/electrostrictive ceramic composition is formed on a substrate made of a ceramic material or the electrode formed on the surface of the substrate. Examples of a method of forming the electrode include ion beam, sputtering, vacuum evaporation, PVD, ion plating, CVD, plating, screen printing, spraying and dipping. Above all, the sputtering method or the screen printing method is preferable in respect of a joining property to the substrate and the piezoelectric/electrostrictive portion. The resultant electrode can be formed integrally with the substrate and/or the piezoelectric/electrostrictive portion by firing (a thermal treatment) at about 600 to 1400° C. This firing may be performed every time the electrode is formed, but may be performed together during the thermal treatment of a layer constituted of the piezoelectric/electrostrictive ceramic composition.

Examples of a method of forming the layer constituted of the piezoelectric/electrostrictive ceramic composition on the substrate include ion beams, sputtering, vacuum evaporation, PVD, ion plating, CVD, plating, sol-gel, aerosol deposition, screen printing, spraying and dipping. It is to be noted that it is preferable to perform an aerosol deposition method in which after forming a membrane, the only crystal main body portion can be crystallized using, for example, a microwave heating furnace to appropriately adjust the amorphous phase or the lattice strain present in the powder-like piezoelectric/electrostrictive ceramic composition. Furthermore, the screen printing method is preferable because it is possible to easily and continuously form the layer into a high-precision shape and thickness. Next, the electrode is formed on the layer constituted of the piezoelectric/electrostrictive ceramic composition formed on the substrate by a method similar to the above-described method. It is to be noted that on this electrode, the layers constituted of the piezoelectric/electrostrictive ceramic composition, and the electrodes are alternately and repeatedly formed until desired multiple layers are obtained.

Afterward, a laminate obtained by alternately laminating the layers constituted of the piezoelectric/electrostrictive ceramic composition and the electrodes on the substrate is integrally fired. According to the firing, the piezoelectric/electrostrictive portion constituted of the above piezoelectric/electrostrictive body can be bonded in a solid state onto the substrate directly or via the electrode. It is to be noted that the firing does not have to be necessarily integrally performed, and may be successively performed every time one layer constituted of the piezoelectric/electrostrictive ceramic composition is formed, but it is preferable to integrally fire the laminate including the electrodes from a viewpoint of production efficiency.

In this case, a firing temperature is set to preferably 1000 to 1400° C., further preferably 1100 to 1350° C. When the temperature is less than 1000° C., the substrate or the electrode is incompletely bonded in a solid state to the piezoelectric/electrostrictive portion, and the denseness of the piezoelectric/electrostrictive portion sometimes becomes insufficient. When the temperature exceeds 1400° C., the evaporation amount of Pb in the piezoelectric/electrostrictive ceramic composition increases, and it is sometimes difficult to form the piezoelectric/electrostrictive portion having a desired composition. A time to retain a maximum temperature during the firing is usually about one minute to ten hours, preferably about five minutes to four hours. Furthermore, when a temperature higher than Curie point or a temperature just below Curie point is rapidly lowered to control a thermal contraction speed in a temperature lowering process after the firing, a thermal stress applied to the piezoelectric/electrostrictive body due to a thermal expansion difference from the substrate can be controlled. In consequence, the surface layer portion having a mechanical strength lower than that of the crystal main body portion can effectively be formed into a crystal structure different from that of the crystal main body portion.

Afterward, a polarization treatment is performed on appropriate conditions. In this case, the polarization treatment is preferably performed by performing heating and applying the electric field by a known technique. It is to be noted that a heating temperature depends on Curie point of a piezoelectric/electrostrictive ceramic material, and is preferably set to 40 to 200° C.

EXAMPLES

The present invention will hereinafter specifically be described hereinafter in accordance with examples, but the present invention is not limited to these examples. There will be described hereinafter methods of measuring various physical values and evaluating characteristics.

[Surface Layer Portion Thickness/Crystal Particle Diameter]: A supposed crystal structure was phase-identified as a material file by X-ray diffraction to quantify the area ratio of each crystal phase by an electron backscatter diffraction pattern (EBSD) process. On the other hand, crystal particle diameters were beforehand obtained by an intercept process using a scanning electron microscope. The crystal particle diameters obtained by the intercept process were circle corresponding diameters, and a surface layer portion thickness (μm) and a ratio of the surface layer portion thickness to the crystal particle diameters (the surface layer portion thickness/crystal particle diameters (%)) were calculated using the area ratio obtained by the EBSD.

[Flexural Displacement (Displacement Amount)]: A voltage was applied across upper and lower electrodes so as to obtain an electric field of 3 kV/mm, and a generated flexural displacement (displacement amount (μm)) was measured using a laser displacement measurement unit.

[Curie Point (Tc)]: An electric furnace and an LCR meter were combined, the dependency of the electrostatic capacity of the piezoelectric/electrostrictive membrane element on the temperature was measured with a temperature rise rate of 0.5° C./min, and a temperature at which the electrostatic capacity was maximized was obtained as Curie point.

[Tetragonal System Lattice Constant Ratio (c/a)]: This ratio was measured using an X-ray diffraction device on conditions including 2θ-θ step scanning, a step width of 0.01 and a count of 20,000 or more, and the ratio was calculated from the following equation (3) using face spaces d(001) and d(100) obtained from peak positions corresponding to (001) and (100) of the resultant profile.

$$c/a = d(001)/d(100) \qquad (3)$$

Example 1

Oxides of elements (PbO, NiO, $Nb_2O_5$, $TiO_2$ and $ZrO_2$) were weighed and mixed so as to obtain a ratio (a molar ratio) represented by a composition formula [$Pb_{1.00}(Ni_{1/3}Nb_{2/3})_{0.35}Ti_{0.41}Zr_{0.25}O_3$], and mixed with water to obtain a slurry-like material. A slurry obtained by mixing the materials using a ball mill of a ball made of zirconia for 40 hours was dried, and then calcined at 950° C. to obtain a piezoelectric/electrostrictive ceramic composition. The resultant piezoelectric/electrostrictive ceramic composition was crushed again by the ball mill with a peripheral speed of 10 m/sec to obtain a powder-like piezoelectric/electrostrictive ceramic composition having powder (particle) surfaces constituted of an amorphous phase and a crystal phase including a lattice strain, and having an average particle diameter of 0.3 μm. A binder and a solvent were added to the resultant powder-like piezoelectric/electrostrictive ceramic composition, and mixed using a tri-roll mill to obtain a piezoelectric/electrostrictive material paste.

A lower electrode (1.2 mm×0.8 mm×3 μm) made of platinum (Pt) by a screen printing process was formed on a substrate (1.6 mm×1.1 mm×100 μm) made of zirconia ($ZrO_2$) stabilized by yttria ($Y_2O_3$) and obtained by performing forming and firing by a green sheet laminating process. The substrate and the lower electrode were integrated by a thermal treatment at 1300° C. for two hours. A piezoelectric/electrostrictive material paste was laminated with a dimension of 1.3 mm×0.9 mm×15 μm on the lower electrode by a screen printing process, and firing was performed on conditions including a temperature rise rate: 200° C./h, a maximum temperature:

1250° C., a retention time: three hours, a temperature rise rate to 400° C.: 200° C./h and a temperature drop rate from 400° C. to room temperature: 400° C./h, to form a membranous piezoelectric/electrostrictive portion.

including the tetragonal system, and surface layer portions arranged in a part of the outer peripheries of the crystal main body portions and including the rhombic system and the quasi-cubic system.

TABLE 1

| | Composition | Curie point (° C.) | d(002)/d(200)*[1] | Surface layer portion thickness/crystal particle diameters (%) | Surface layer portion thickness (μm) | Displacement amount (μm) |
|---|---|---|---|---|---|---|
| Example 1 | $Pb_{1.00}(Ni_{1/3}Nb_{2/3})_{0.35}Ti_{0.41}Zr_{0.25}O_3$ | 210 | 1.015 | 1 | 0.1 | 0.22 |
| Example 2 | $Pb_{1.00}(Ni_{1/3}Nb_{2/3})_{0.30}Ti_{0.42}Zr_{0.28}O_3$ | 240 | 1.015 | 3 | 0.26 | 0.23 |
| Example 3 | $Pb_{1.00}\{(Ni_{0.13}Mg_{0.87})_{1/3}Nb_{2/3}\}_{0.24}Ti_{0.42}Zr_{0.34}O_3$ | 280 | 1.015 | 15 | 0.82 | 0.21 |
| Example 4 | $Pb_{1.00}\{(Ni_{0.17}Mg_{0.83})_{1/3}Nb_{2/3}\}_{0.20}Ti_{0.43}Zr_{0.37}O_3$ + 0.2mass % NiO | 310 | 1.015 | 20 | 1.05 | 0.18 |
| Example 5 | $Pb_{1.00}\{(Ni_{0.13}Mg_{0.87})\}_{1/3}Nb_{2/3}Ti_{0.43}Zr_{0.37}O_3$ | 310 | 1.020 | 0.05 | 0.003 | 0.19 |

*[1]the lattice constant ratio (c/a) of the tetragonal system

On the formed piezoelectric/electrostrictive portion, an upper electrode (1.2 mm×0.8 mm×0.5 μm) made of gold (Au) was laminated by a screen printing process, and then a thermal treatment was performed. A polarization treatment of 60 V× ten seconds was performed on a hot plate at 75° C. to obtain a piezoelectric/electrostrictive membrane element (Example 1). The resultant piezoelectric/electrostrictive membrane element had a displacement amount of 0.22 μm. Moreover, a piezoelectric/electrostrictive material constituting the piezoelectric/electrostrictive portion had a Curie point (Tc) of 210° C., and a tetragonal system lattice constant ratio (c/a) of d(002)/d(200)=1.015.

Examples 2 to 5

Figure 7:
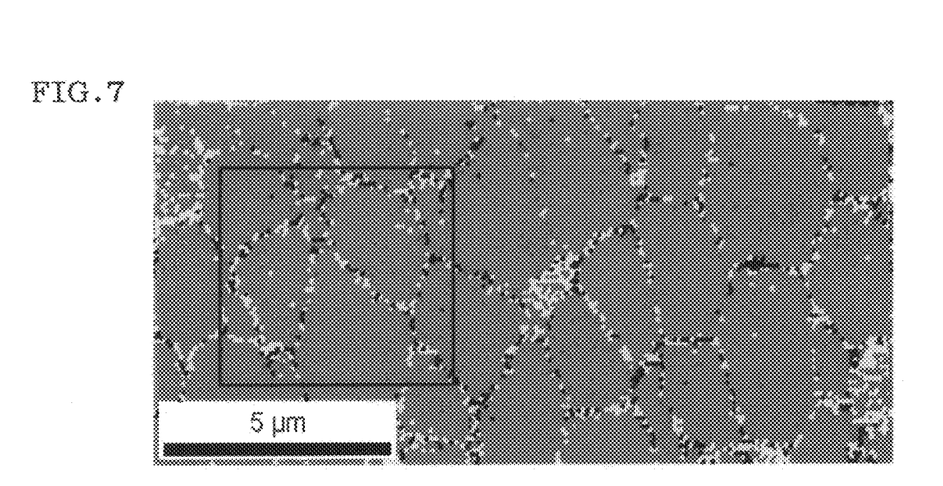
FIG. 7 is a photograph showing a gray level image showing, in a display, the result of the analysis of a piezoelectric/electrostrictive portion of a piezoelectric/electrostrictive membrane element of Example 2 by an electron backscatter diffraction pattern process.
Figure 8:
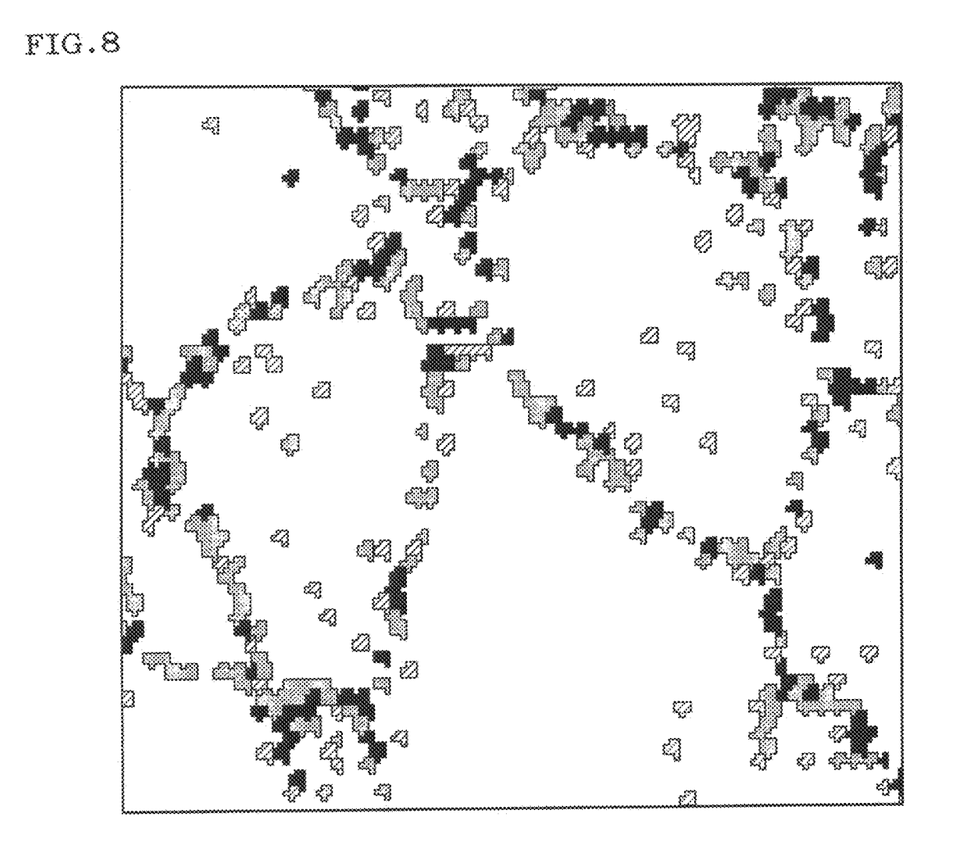
FIG. 8 is a replica diagram showing an enlarged part of FIG. 7.
Figure 9:
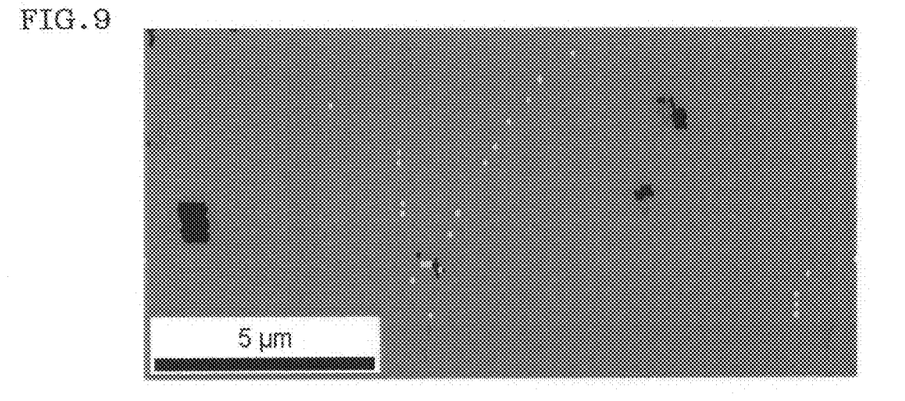
FIG. 9 is a photograph showing a gray level image showing, in a display, the result of the analysis of a piezoelectric/electrostrictive portion of a piezoelectric/electrostrictive membrane element of Example 5 by the electron backscatter diffraction pattern process.

Piezoelectric/electrostrictive membrane elements (Examples 2 to 5) were obtained in the same manner as in Example 1 described above except that a piezoelectric/electrostrictive ceramic composition was adjusted so as to obtain Curie point (Tc) and tetragonal system lattice constant ratio of values shown in Table 1. Measurement results of various physical values of the resultant piezoelectric/electrostrictive membrane elements are shown in Table 1. Moreover, FIG. 7 is a photograph showing a gray level image showing, in a display, the result of the analysis of a piezoelectric/electrostrictive portion of a piezoelectric/electrostrictive membrane element of Example 2 by an electron backscatter diffraction pattern process, and FIG. 8 is a replica diagram showing an enlarged part of FIG. 7. It is to be noted that in the original drawing of FIG. 7, a tetragonal system is shown in red, a rhombic system is shown in yellow and a quasi-cubic system is shown in green, and it can clearly be grasped that a large number of crystal particles are constituted of crystal main body portions including the tetragonal system, and surface layer portions arranged in the outer peripheries of the crystal main body portions and including the rhombic system and the quasi-cubic system. Moreover, in FIG. 8, the tetragonal system is shown in white, the rhombic system is shown by dots and the quasi-cubic system is shown by hatching, respectively. Furthermore, FIG. 9 is a photograph showing a gray level image showing, in a display, the result of the analysis of a piezoelectric/electrostrictive portion of a piezoelectric/electrostrictive membrane element of Example 5 by the electron backscatter diffraction pattern process. Even in the original drawing of FIG. 9, a tetragonal system is shown in red, a rhombic system is shown in yellow and a quasi-cubic system is shown in green, and it can be grasped that a large number of crystal particles are constituted of crystal main body portions A piezoelectric/electrostrictive membrane element of the present invention has excellent piezoelectric/electrostrictive characteristics, and is suitable for an actuator, a sensor or the like.

What is claimed is:

1. A piezoelectric/electrostrictive membrane element comprising:
   a ceramic substrate;
   a membranous piezoelectric/electrostrictive portion including a piezoelectric/electrostrictive body comprising a large number of crystal particles having a lead zirconate titanate piezoelectric/electrostrictive ceramic composition; and
   membranous electrodes electrically connected to the piezoelectric/electrostrictive portion;
   wherein the crystal particles each include a crystal main body portion defining a core portion and having a predetermined crystal structure, and a surface layer portion defining a shell portion and having a crystal structure which is different from the predetermined crystal structure of the crystal main body portion, wherein a composition of the crystal main body portion is the same as that of the surface layer portion, and wherein the shell portion of the crystal particles is present in locations where adjacent crystal particles contact each other within the piezoelectric/electrostrictive body defining interior grain boundaries between the adjacent crystal particles within the piezoelectric/electrostrictive body, and
   wherein the piezoelectric/electrostrictive portion is bonded in a solid state to the substrate directly or via the electrodes.

2. The piezoelectric/electrostrictive membrane element according to claim 1, wherein an average thickness of the surface layer portion is in a range of 1 to 15% of an average particle diameter of the crystal particles.

3. The piezoelectric/electrostrictive membrane element according to claim 1, wherein the predetermined crystal structure of the crystal main body portion includes at least a tetragonal system; and
   wherein the predetermined crystal structure of the surface layer portion includes at least one crystal structure selected from the group consisting of a rhombic system, a monoclinic system and a quasi-cubic system.

4. The piezoelectric/electrostrictive membrane element according to claim 1, wherein the piezoelectric/electrostrictive ceramic composition contains a $PbMg_{1/3}Nb_{2/3}O_3$—

$PbZrO_3$—$PbTiO_3$ three-component solid solution composition as a main composition, and further contains 0.5 to 10 mass% of NiO.

5. The piezoelectric/electrostrictive membrane element according to claim 4, wherein the $PbMg_{1/3}Nb_{2/3}O_3$—$PbZrO_3$—$PbTiO_3$ three-component solid solution composition is represented by the following general formula (1):

$$Pb_x(Mg_{y/3}Nb_{2/3})_aTi_bZr_cO_3 \qquad (1),$$

wherein $0.95 \leq x \leq 1.05$, $0.8 \leq y \leq 1.0$, and a, b, and c are decimals in a range surrounded by (a, b, c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in a coordinate whose coordinate axes are a, b, and c, and wherein a+b+c=1.000.

6. The piezoelectric/electrostrictive membrane element according to claim 1, wherein the piezoelectric/electrostrictive ceramic composition contains a $Pb(Mg, Ni)_{1/3}Nb_{2/3}O_3$—$PbZrO_3$—$PbTiO_3$ three-component solid solution composition.

7. The piezoelectric/electrostrictive membrane element according to claim 6, wherein the $Pb(Mg, Ni)_{1/3}Nb_{2/3}O_3$—$PbZrO_3$—$PbTiO_3$ three-component solid solution composition is represented by the following general formula (2):

$$Pb_x\{(Mg_{1-y}Ni_y)_{(1/3)xa}Nb_{2/3}\}_bTi_cZr_dO_3 \qquad (2),$$

wherein $0.95 \leq x \leq 1.05$, $0 \leq y \leq 1.00$, $0.90 \leq a \leq 1.00$, and b, c, and d are decimals in a range surrounded by (b, c, d) =(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in a coordinate whose coordinate axes are b, c, and d, and wherein b+c+d=1.000.

* * * * *

UNITED STATES PATENT AND TRADEMARK OFFICE
CERTIFICATE OF CORRECTION

| | | |
|---|---|---|
| PATENT NO. | : 8,080,923 B2 | |
| APPLICATION NO. | : 12/316079 | |
| DATED | : December 20, 2011 | |
| INVENTOR(S) | : Takaaki Koizumi and Toshikatsu Kashiwaya | |

It is certified that error appears in the above-identified patent and that said Letters Patent is hereby corrected as shown below:

Title Page, Item (56), References Cited, Foreign Patent Documents:

*please change* "JP 10458060 6/1998" to --JP 10-158060 6/1998--

Signed and Sealed this
Twenty-first Day of February, 2012

David J. Kappos
*Director of the United States Patent and Trademark Office*